United States Patent
Sugiyama et al.

(10) Patent No.: US 7,214,622 B2
(45) Date of Patent: May 8, 2007

(54) MANUFACTURING METHOD OF SEMICONDUCTOR DEVICE

(75) Inventors: Michiaki Sugiyama, Tokyo (JP); Nobuhiro Kinoshita, Kodaira (JP); Junpei Konno, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/187,981

(22) Filed: Jul. 25, 2005

(65) Prior Publication Data

US 2006/0030075 A1 Feb. 9, 2006

(30) Foreign Application Priority Data

Aug. 3, 2004 (JP) ............................. 2004-226600

(51) Int. Cl.
*H01L 21/302* (2006.01)

(52) U.S. Cl. ................ 438/689; 438/612; 257/E21.007

(58) Field of Classification Search .................... 438/5, 438/7, 10–11, 14, 16–18, 22–24, 29, 34, 64, 438/128, 130, 484, 538

See application file for complete search history.

(56) References Cited

U.S. PATENT DOCUMENTS

| | | | | |
|---|---|---|---|---|
| 2003/0139029 A1* | 7/2003 | Haba et al. | .................. | 438/612 |
| 2004/0067650 A1* | 4/2004 | Dache et al. | ................ | 438/689 |
| 2004/0238934 A1* | 12/2004 | Warner et al. | .............. | 257/686 |

FOREIGN PATENT DOCUMENTS

JP 5-327195 12/1993

* cited by examiner

*Primary Examiner*—Michael Lebentritt
*Assistant Examiner*—Andre' Stevenson
(74) *Attorney, Agent, or Firm*—Antonelli, Terry, Stout and Kraus, LLP.

(57) ABSTRACT

In the assembly of a semiconductor device, improvement in the reliability of flip chip bonding is aimed at. By forming a dummy terminal in the end portion of the row of a plurality of terminals for a flip chip in the package substrate, the flow of flux or solder can be suppressed with the dummy terminal, and a solder layer can be formed on the plurality of terminals for a flip chip. Thereby, the thickness of the solder layer formed on each terminal for a flip chip can fully be secured, without making solder adhere to the wire connection terminal closely formed to the terminal for a flip chip. As a result, improvement in the reliability of flip chip bonding can be aimed at.

9 Claims, 12 Drawing Sheets

MANUFACTURING METHOD OF SEMICONDUCTOR DEVICE

CROSS-REFERENCE TO RELATED APPLICATION

The present application claims priority from Japanese patent application No. 2004-226600 filed on Aug. 3, 2004, the content of which is hereby incorporated by reference into this application.

1. Field of the Invention

The present invention relates to a manufacturing method of a semiconductor device, and particularly relates to an effective technology in the application to flip chip bonding.

2. Description of the Background Art

In a conventional printed circuit board, a dummy electrode is formed at the outside of the electrode of an end portion among the electrodes of a substrate, and a solder pre-coating part is formed by the plating means, a screen printing means, etc. on an electrode and a dummy electrode (for example, refer to Patent Reference 1).

[Patent Reference 1] Japanese Unexamined Patent Publication No. Hei 5-327195 (FIG. 1)

SUMMARY OF THE INVENTION

The chip stacked layer type semiconductor device which stacked a plurality of semiconductor chips on many stages as an example of the semiconductor device which applied flip chip bonding is known, and in such a chip stacked layer type semiconductor device, flip chip bonding of the semiconductor chip of the bottom is mainly performed at a wiring substrate.

A chip stacked layer type semiconductor device will require making pitch of the pads (electrodes) narrow by miniaturization or making pins many more and more from now on. However, by making pitch of pads narrow, the under-filling molding to a flip chip connection is, since requiring time for osmosis of resin etc., becoming very difficult. Therefore, the technology of pressurizing and heating a semiconductor chip and performing flip chip bonding after applying adhesives previously on a wiring substrate before arranging a semiconductor chip, and arranging a semiconductor chip on these adhesives is developed.

On each terminal with which flip chip bonding is performed of a wiring substrate, the solder layer by solder pre-coating is formed, respectively, and flip chip bonding is performed in this condition.

The inventors found out the following problems, as a result of examining the formation technology of a solder layer to each terminal for flip chip bonding.

Namely, if soldering paste and the flux are applied to the whole terminal row for flip chip bonding and reflow is performed after that, the solder and flux which were melted flow out and the solder layer by a small quantity of solder is formed on the terminal arranged at the end portion of a terminal row as compared with the terminal of central side. That is, the solder layer formed on the terminal of an end portion is thin as compared with the solder layer on the terminal of central side.

As for this, while the terminals of these both sides are suppressing runoff of solder and the flux since terminals are arranged with the terminal of central side in those neighbors, with the terminal of an end portion, since the one side serves as an open area, without arranging a terminal, solder and the flux will flow out. If the activity of the solder by the flux will be high enough even if runoff of solder and the flux occurs, solder is supplied to an electrode from the flux of a larger area, and it is possible also when the solder coat of sufficient amount is formed also in the terminal of the area where the flux flowed out. However, in the electrode for flip chip bonding, since the terminal pitch is extremely small as compared with, for example a mounting board, a mother board, etc., the maximum amount of the solder coat which can be supplied to a terminal is restrained remarkably. Therefore, the material whose activity over solder is comparatively low also must be used as flux to be used. The inventors found out that, if runoff of the flux occurs when the flux with low activity is used like this, the amount of the solder on the terminal of the area is insufficient, and the problem to which the solder layer formed on a terminal becomes thin becomes serious.

It is a problem that faulty connection occurs by this in flip chip bonding of the terminal arranged at the end portion.

In the case of the wiring substrate used with a chip stacked layer type semiconductor device, the terminal for wire bonding of the semiconductor chip of the second stage other than the terminal for flip chip bonding may be arranged in that main surface making a row approaching this terminal row. Since the terminal for wire bonding is arranged closely in such a wiring substrate and it becomes impossible to connect a wire when solder adheres to the terminal for these wire bonding, encroachment of solder to the terminal row area for wire bonding must be avoided.

Therefore, soldering paste cannot be applied broadly and thickly to the terminal row area for flip chip bonding rather than it, and, as a result, the problem that the solder layer formed at the terminal of an end portion becomes thin arises.

However, there is no description about other electrodes to which the electrode row forming solder pre-coating can be approached, and solder cannot be made to adhere in said Patent Reference 1 (Japanese Unexamined Patent Publication No. Hei 5-327195). Therefore, it is also possible for applying soldering paste broadly and thickly to the electrode row forming solder pre-coating rather than this in the printed circuit board indicated to said Patent Reference 1 to form solder pre-coating with uniform height to each electrode. Although indicated by said Patent Reference 1 about the solder pre-coating to the electrode for soldering electronic parts, it is not indicated about the electrode for flip chip bonding. It is indicated also about neither using the flux with comparatively low activity, when giving solder pre-coating to the electrode for flip chip bonding, nor the above-mentioned trouble accompanying it.

The purpose of the present invention is to provide a manufacturing method of a semiconductor device to be able to aim at improvement in the reliability of flip chip bonding.

The above and other purposes and the new features of the present invention will become clear from description of the specification, and accompanying drawings.

Of the inventions disclosed in the present application, typical ones will next be summarized briefly.

That is, the present invention comprises the steps of: preparing a wiring substrate having a main surface and a back surface, a plurality of first terminals for flip chip bonding being formed constituting a row in the main surface, a dummy terminal being formed at an end portion of the row of the first terminals, and having a second terminal whose surface is covered by precious-metal plating approaching the plurality of first terminals; forming a solder layer over the plurality of first terminals by forming a condition that flux containing particles of solder is applied to an area including the row of the plurality of first terminals, melting the solder by heating the flux after that, and suppressing a flow of the flux with the dummy terminal; arranging a semiconductor chip over the main surface of the wiring substrate; and performing flip chip bonding of the semiconductor chip at the wiring substrate connecting a projection electrode connected over an electrode of the semiconductor chip, and the solder layer over the first terminal by thermo compression bonding.

Next, the present invention comprises the steps of: preparing a wiring substrate having a main surface and a back surface, a plurality of first terminals for flip chip bonding being formed constituting a row in the main surface, an insulating wall part being formed at an end portion of the row of the first terminals, and having a second terminal whose surface is covered by precious-metal plating approaching the plurality of first terminals; forming a solder layer over the plurality of first terminals by forming a condition that flux containing particles of solder is applied to an area including the row of the plurality of first terminals, melting the solder by heating the flux after that, and suppressing a flow of the flux with the insulating wall part; arranging a semiconductor chip over the main surface of the wiring substrate; and performing flip chip bonding of the semiconductor chip at the wiring substrate connecting a projection electrode connected over an electrode of the semiconductor chip, and the solder layer over the first terminal by thermo compression bonding.

Furthermore, the present invention comprises the steps of: preparing a wiring substrate which has a main surface, a back surface, a plurality of first terminals for flip chip bonding formed constituting a row in the main surface, a dummy terminal formed at an end portion of the row of the first terminals, and a second terminal formed its surface being covered by precious-metal plating approaching the plurality of first terminals, and over the plurality of first terminals over which a solder layer was beforehand formed; arranging a semiconductor chip over the main surface of the wiring substrate; and performing flip chip bonding of the semiconductor chip at the wiring substrate connecting a projection electrode connected over an electrode of the semiconductor chip, and the solder layer over the first terminal by thermo compression bonding.

Next, the present invention comprises the steps of: preparing a wiring substrate which has a main surface, a back surface, a plurality of first terminals for flip chip bonding formed constituting a row in the main surface, an insulating wall part formed at an end portion of the row of the first terminals, and a second terminal formed its surface being covered by precious-metal plating approaching the plurality of first terminals, and over the plurality of first terminals over which a solder layer was beforehand formed; arranging a semiconductor chip over the main surface of the wiring substrate; and performing flip chip bonding of the semiconductor chip at the wiring substrate connecting a projection electrode connected over an electrode of the semiconductor chip, and the solder layer over the first terminal by thermo compression bonding.

It will be as follows if the effect acquired by the typical thing among the inventions indicated in a present application is explained briefly.

By providing the dummy terminal in the end portion of the row of a plurality of first terminals for flip chip bonding in the wiring substrate, the flow of the flux can be controlled with a dummy terminal and a solder layer can be formed on a plurality of first terminals. The solder layer thickness formed on the each first terminal can fully be secured by this, and, as a result, improvement in the reliability of flip chip bonding can be aimed at.

DETAILED DESCRIPTION OF THE PREFERRED EMBODIMENTS

Figure 1:
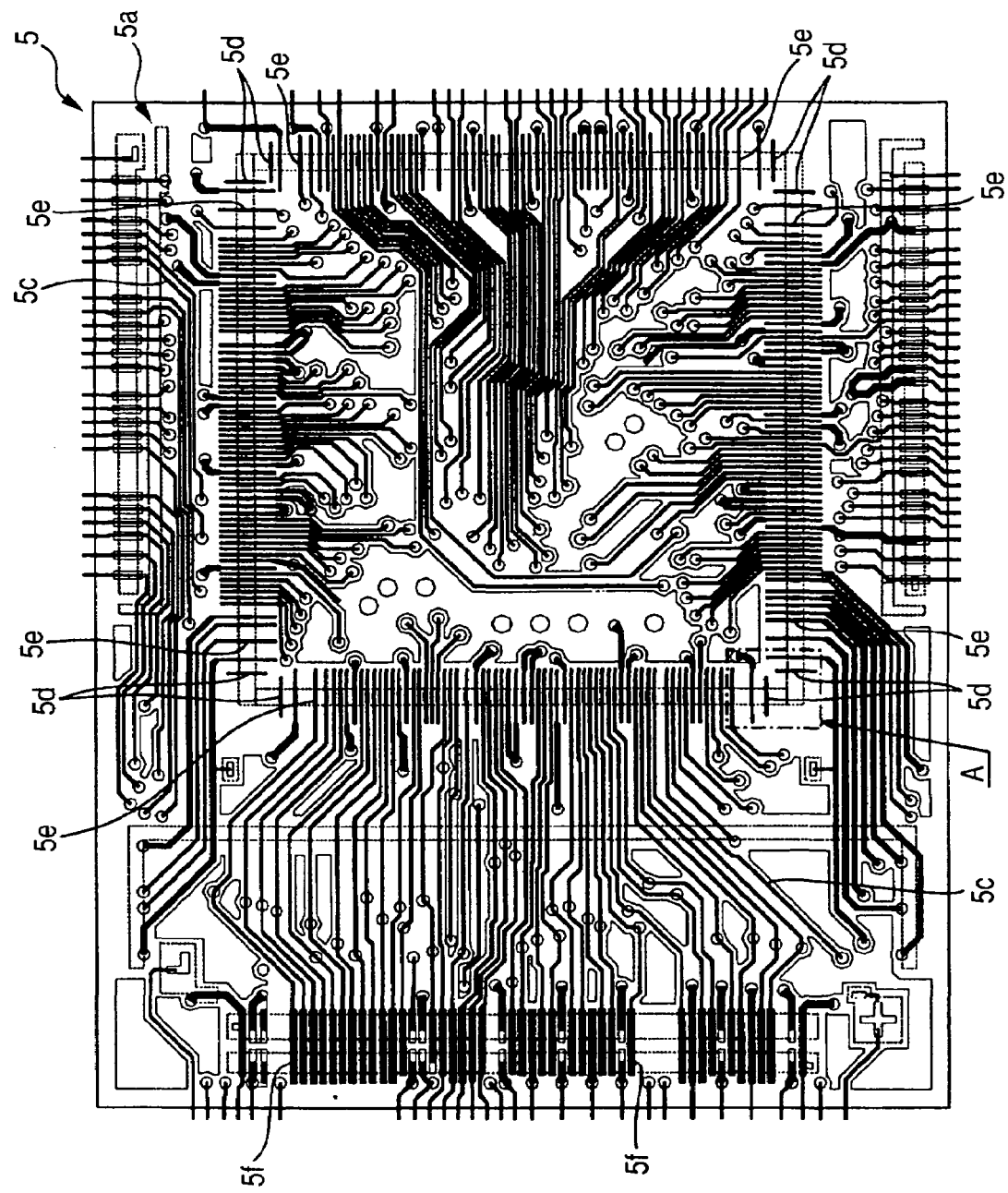
FIG. 1 is a plan view showing an example of the wiring pattern of a wiring substrate used with the manufacturing method of the semiconductor device of Embodiment of the invention.

In the following embodiment, description of the same or the same part is not repeated in principle except for the time when particularly required.

Moreover, in the below-described embodiment, a description will be made after divided in plural sections or in plural embodiments if necessary for convenience's sake. These plural sections or embodiments are not independent each other, but in a relation such that one is a modification example, details, complementary description, etc. of a part or whole of the other one unless otherwise specifically indicated.

In the below-described embodiments, when a reference is made to the number of elements, etc. (including the number, value, amount, range, etc.), the number is not limited to a specific number but can be greater than or less than the specific number unless otherwise specifically indicated or principally apparent that the number is limited to the specific number.

Hereafter, an embodiment of the invention is explained in detail based on drawings. In all the drawings for describing the embodiment, like members of the same function will be identified by like reference numerals and overlapping descriptions will be omitted.

Embodiment

Figure 2:
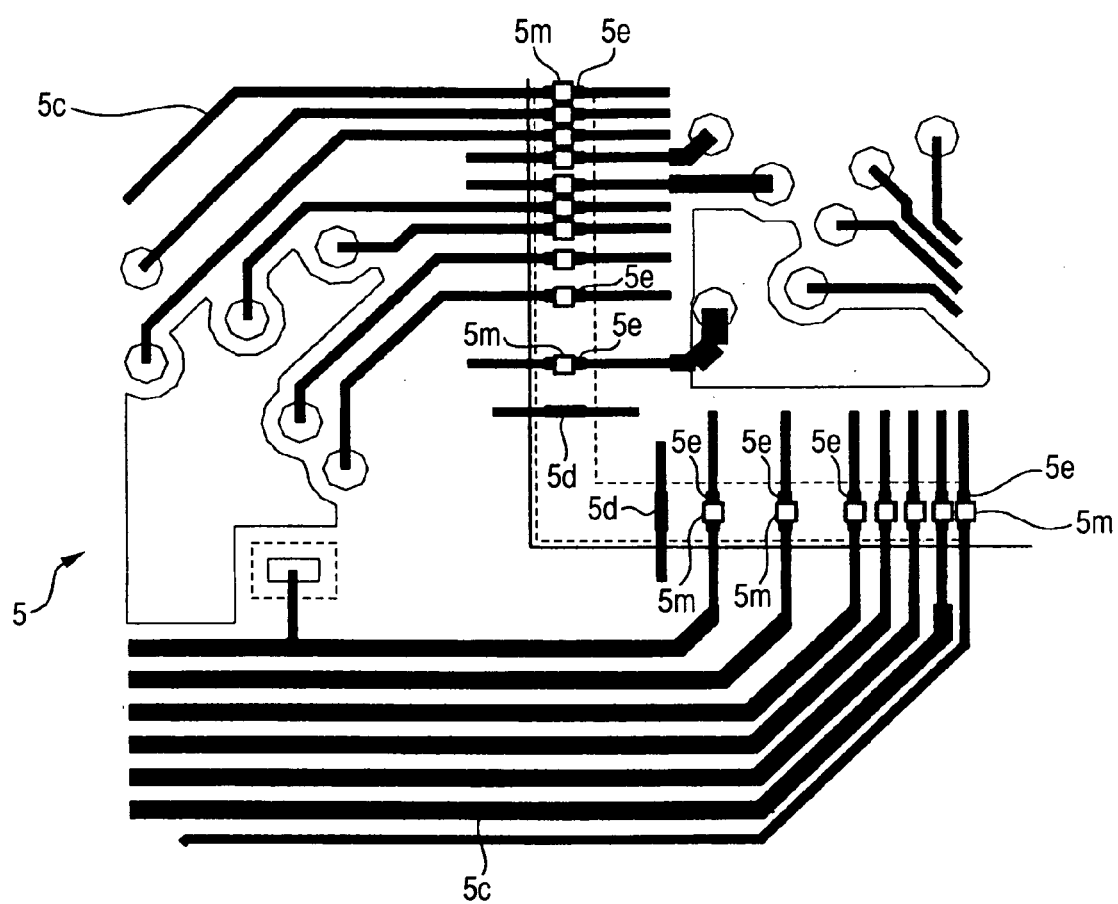
FIG. 2 is an enlarged part plan view showing the configuration of the A section shown in FIG. 1.
Figure 3:
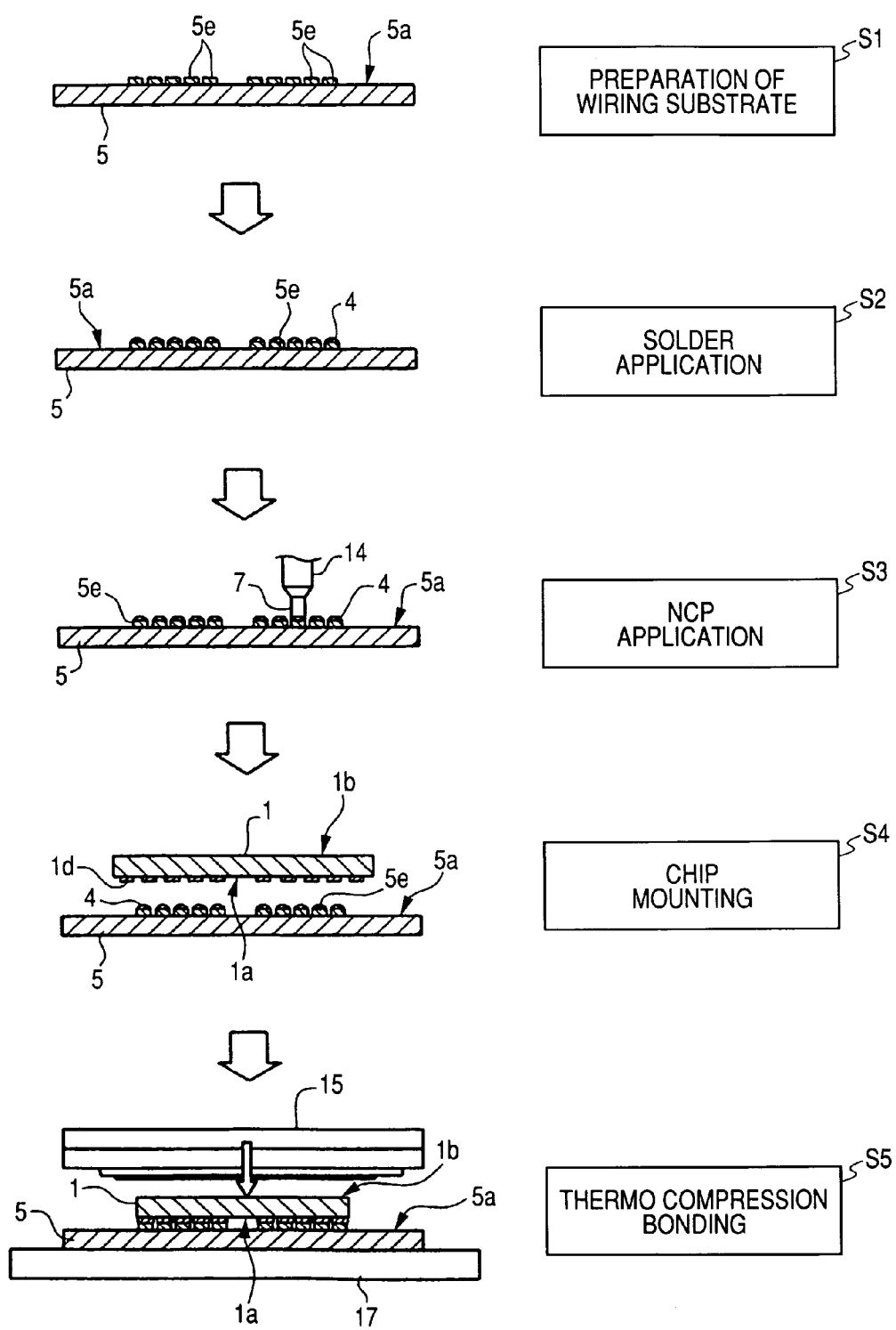
FIG. 3 is an assembly flow diagram showing an example of the assembly to the flip chip bonding in the manufacturing method of the semiconductor device of Embodiment of the invention.
Figure 4:
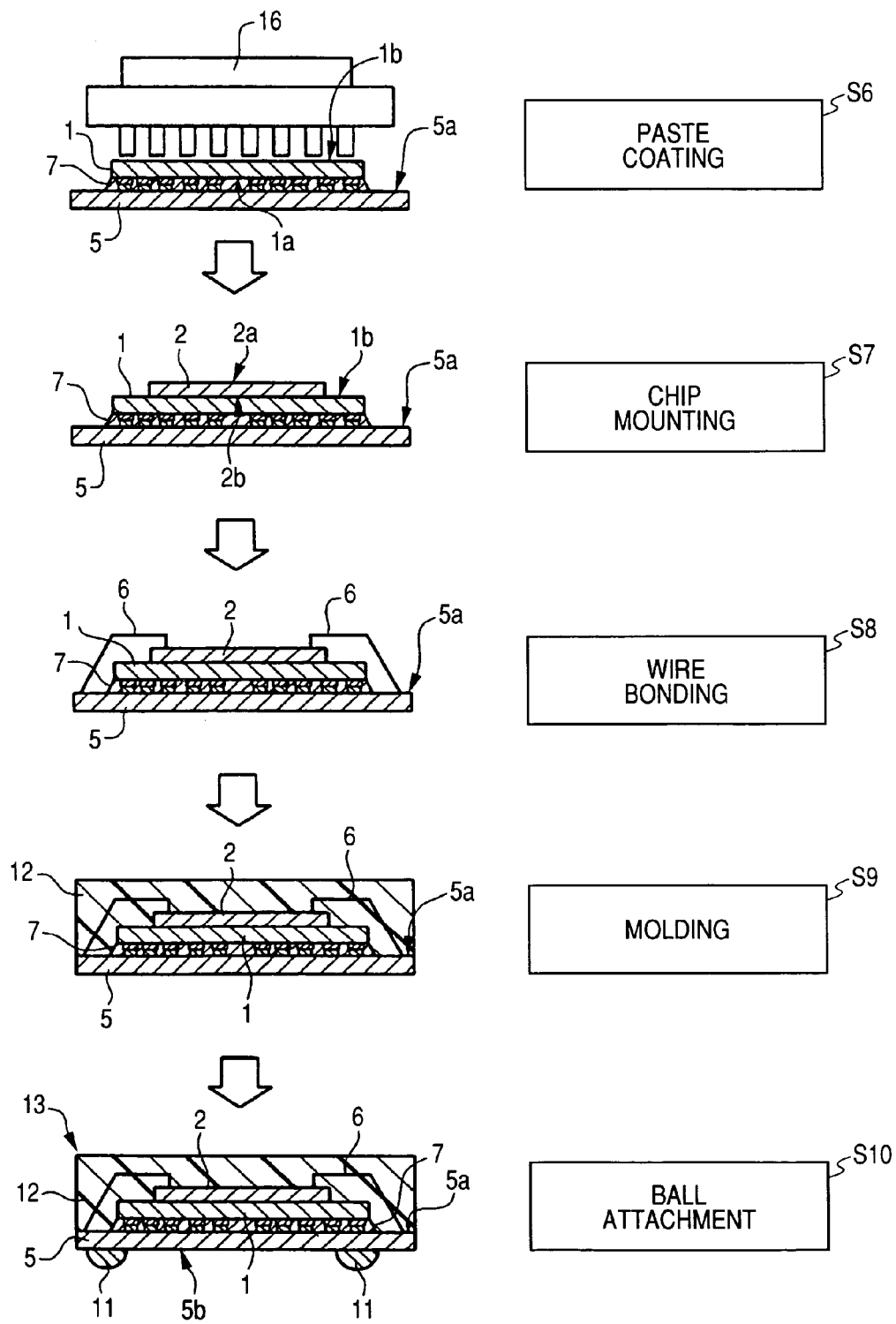
FIG. 4 is an assembly flow diagram showing an example of the assembly after the flip chip bonding in the manufacturing method of the semiconductor device of Embodiment of the invention.
Figure 5:
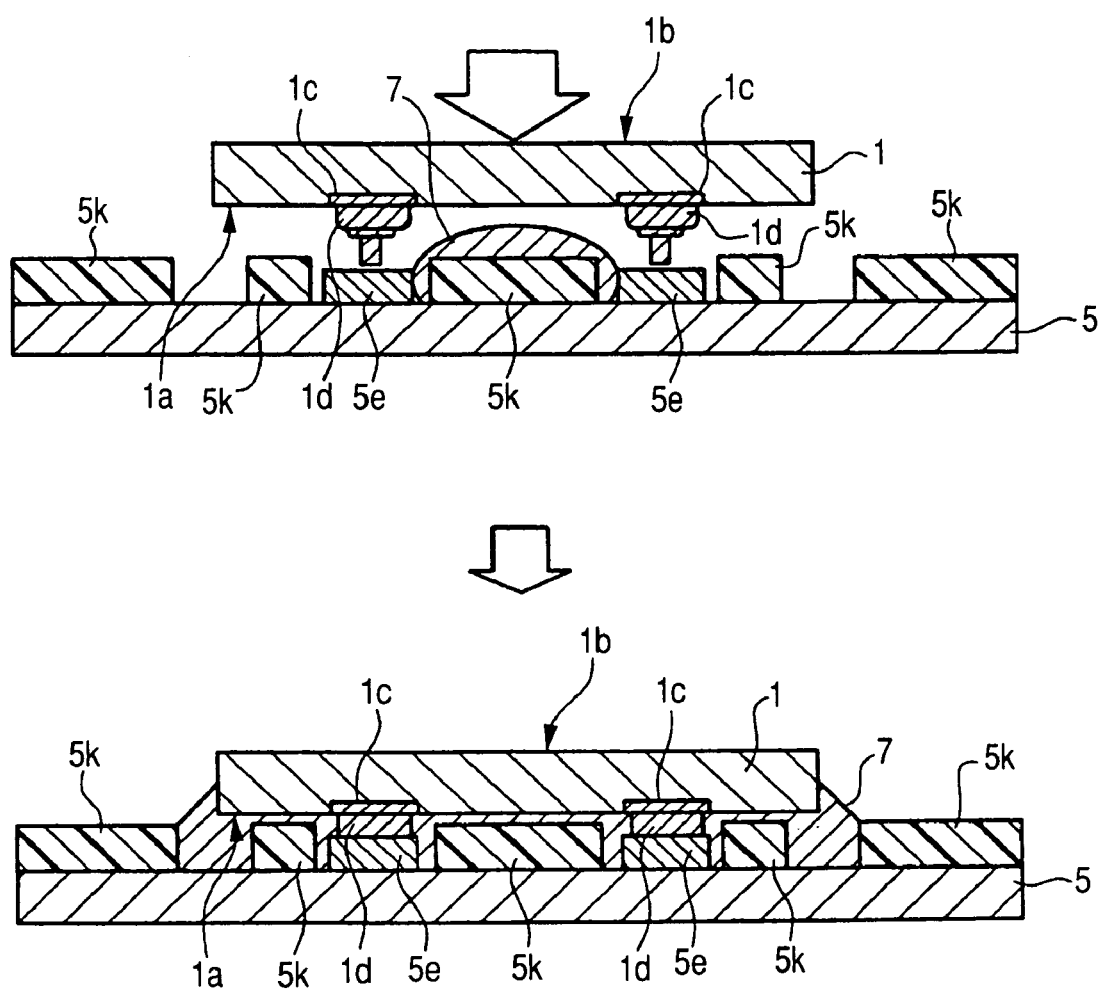
FIG. 5 is an expanded sectional view showing an example of the thermocompression bonding step in the assembly flow shown in FIG. 3.
Figure 6:
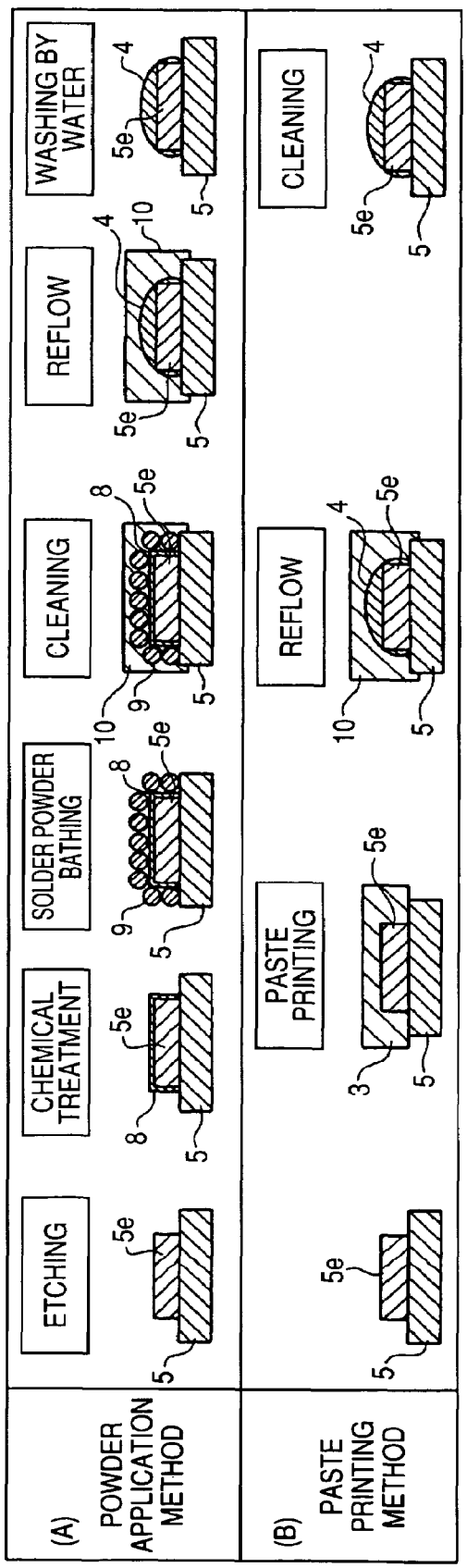
FIG. 6 is a sectional view comparing and showing two examples of the solder formation method to the terminal row of a wiring substrate in the manufacturing method of the semiconductor device of Embodiment of the invention.
Figure 7:
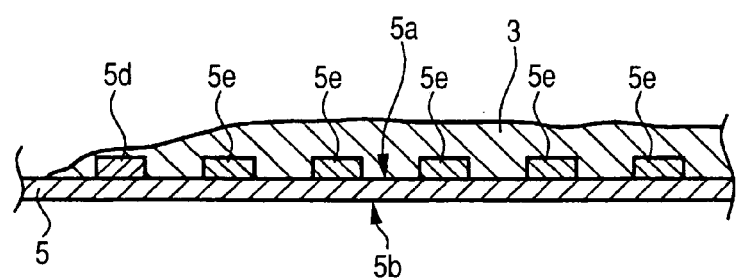
FIG. 7 is a partially sectional view showing an example of the application state of soldering paste to a terminal row in the manufacturing method of the semiconductor device of Embodiment of the invention.
Figure 8:
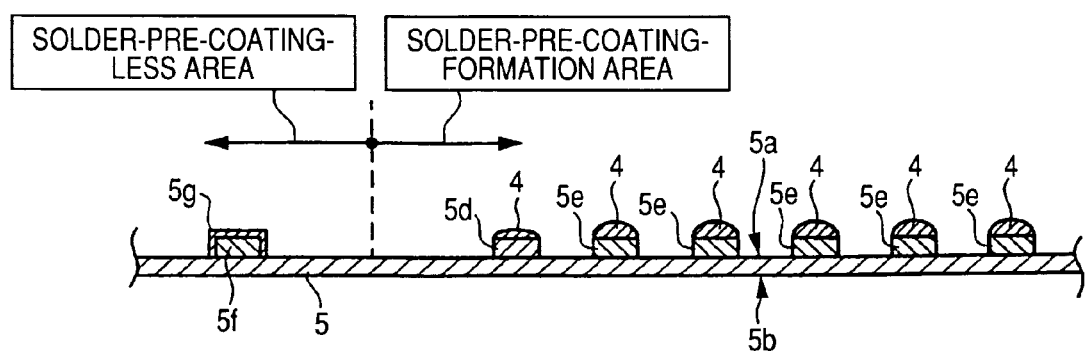
FIG. 8 is a partially sectional view showing an example of the configuration after cleaning of the application state of soldering paste shown in FIG. 7, and the configuration of the second terminal of a solder-pre-coating-less area.
Figure 9:
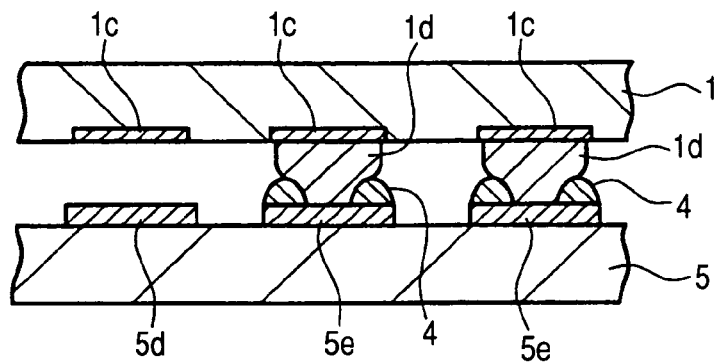
FIG. 9 is an enlarged part sectional view showing an example of the configuration of flip chip bonding in the manufacturing method of the semiconductor device of Embodiment of the invention.
Figure 10:
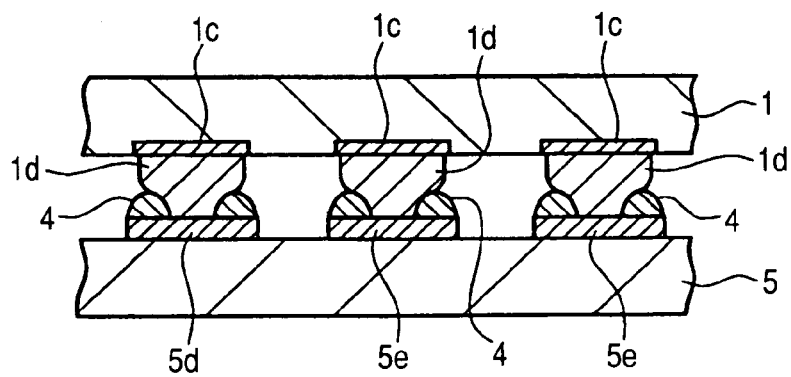
FIG. 10 is an enlarged part sectional view showing the configuration of flip chip bonding of the modification in the manufacturing method of the semiconductor device of Embodiment of the invention.
Figure 11:
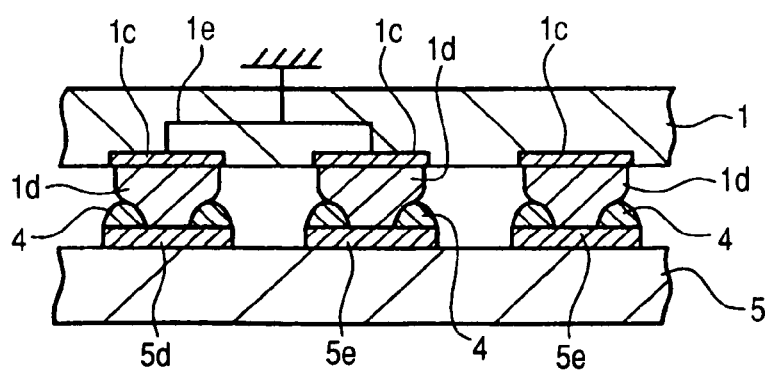
FIG. 11 is an enlarged part sectional view showing the configuration of flip chip bonding of the modification in the manufacturing method of the semiconductor device of Embodiment of the invention.
Figure 12:
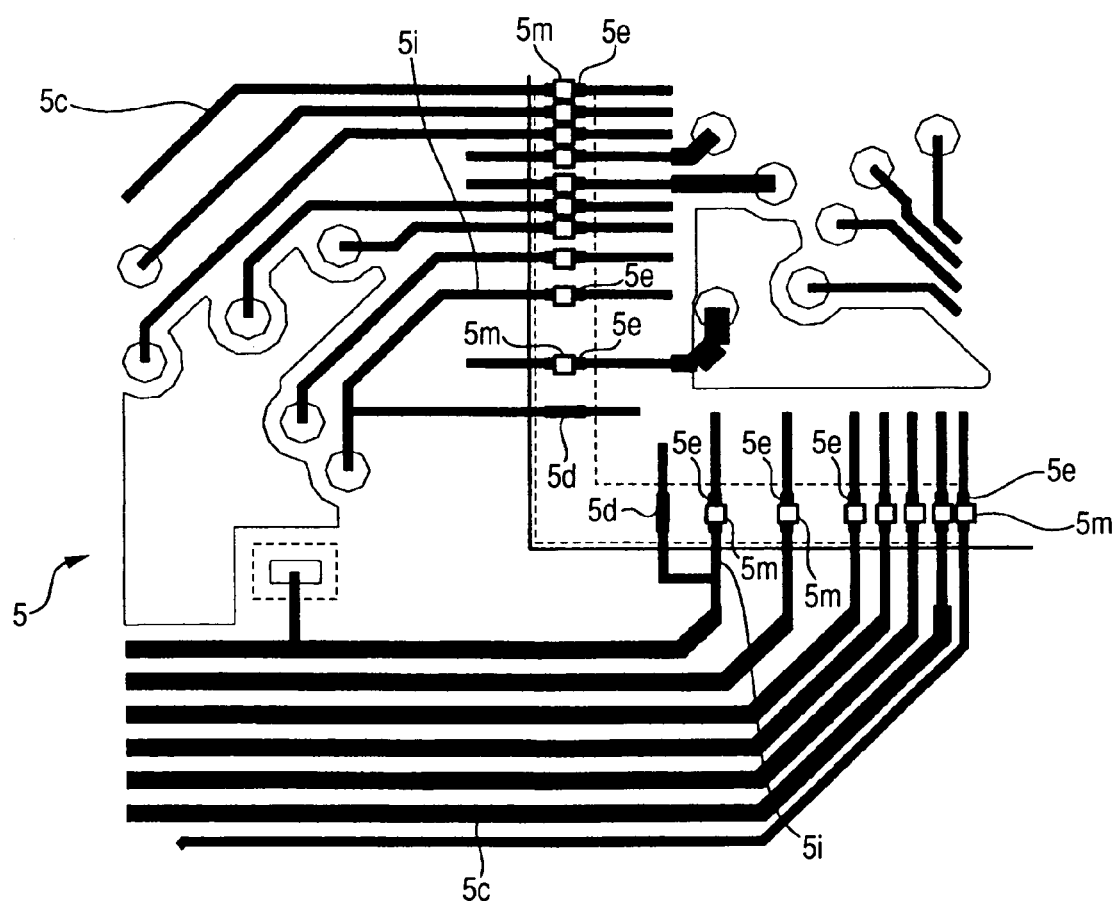
FIG. 12 is an enlarged part plan view showing the modification of the configuration of the A section shown in FIG. 1.
Figure 13:
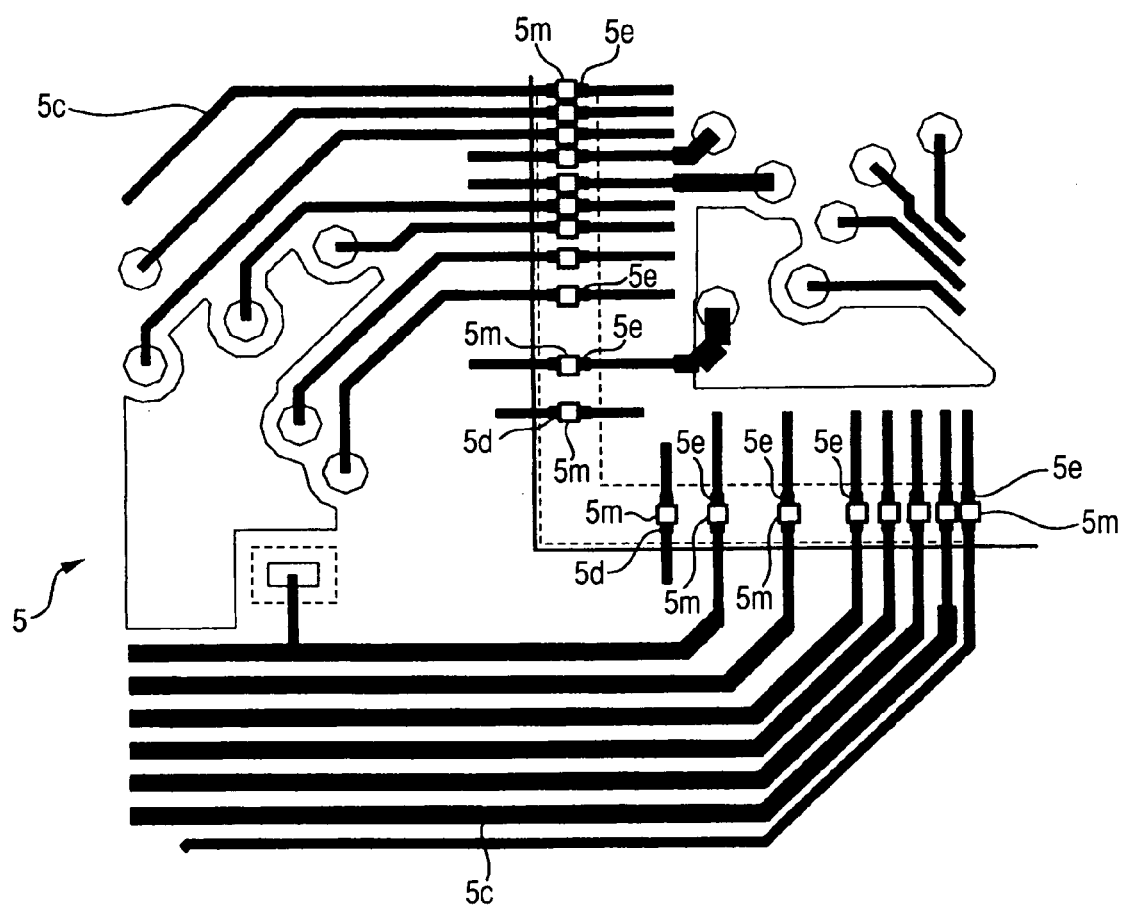
FIG. 13 is an enlarged part plan view showing the modification of the configuration of the A section shown in FIG. 1.
Figure 14:
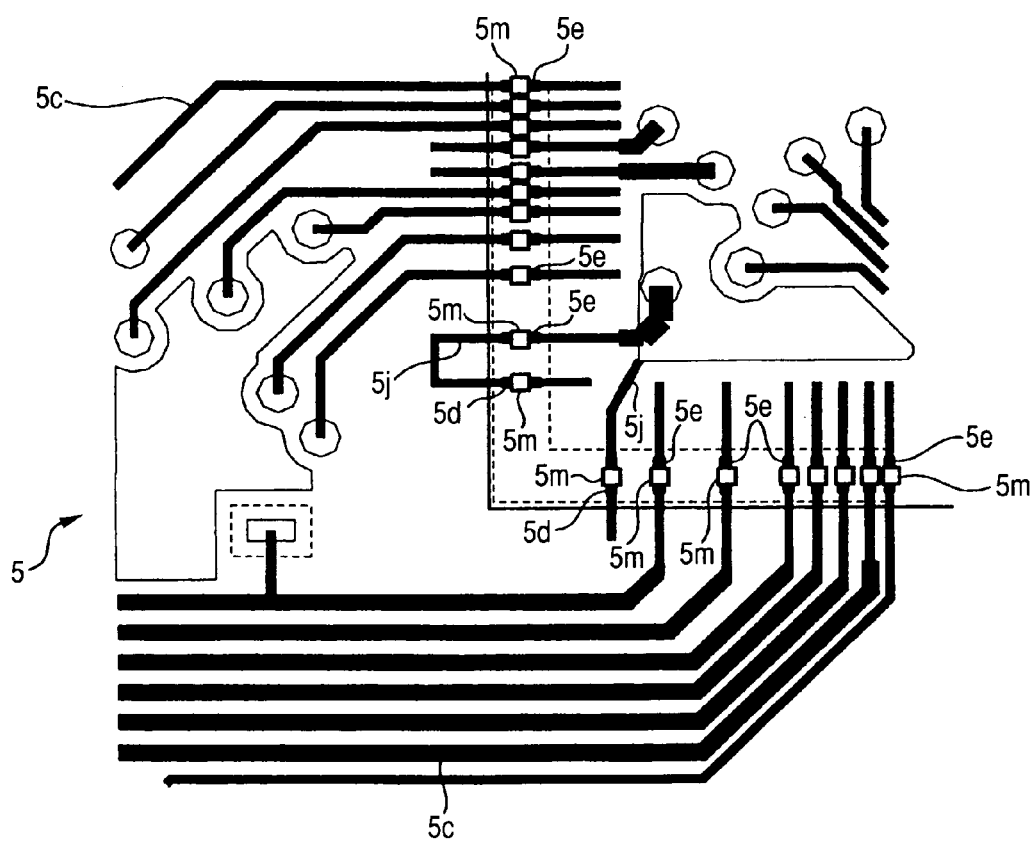
FIG. 14 is an enlarged part plan view showing the modification of the configuration of the A section shown in FIG. 1.
Figure 15:
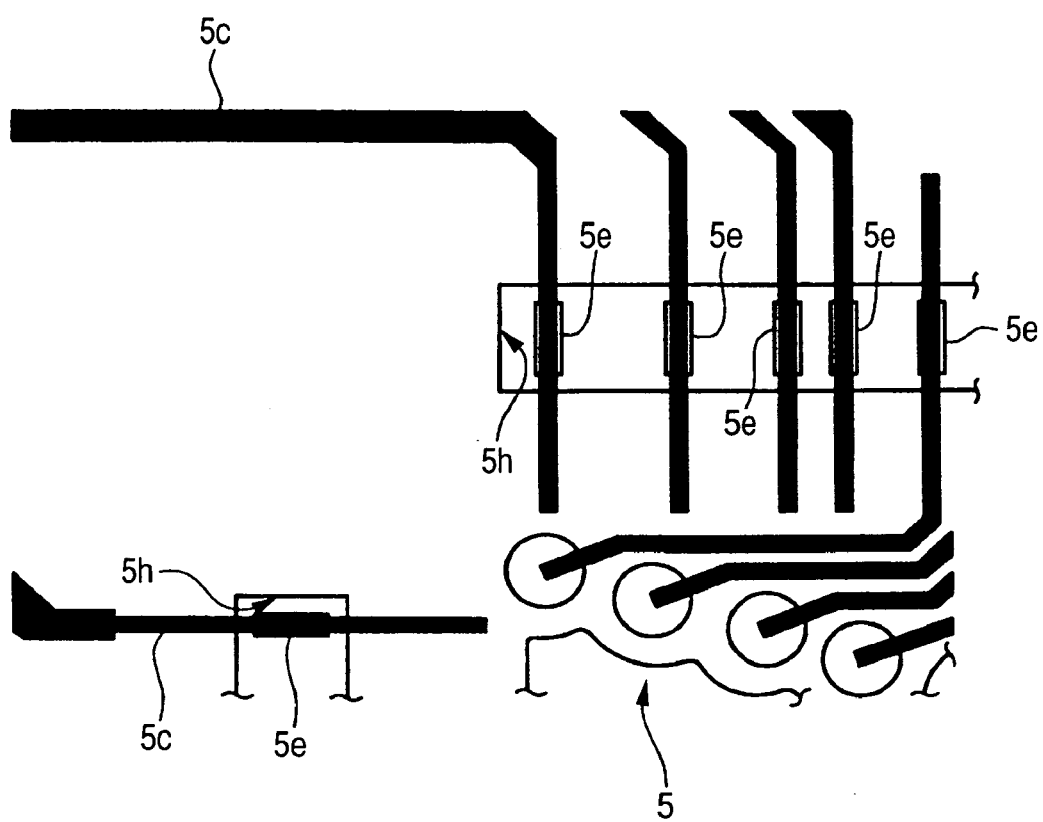
FIG. 15 is an enlarged part plan view showing the configuration of a wiring substrate of the modification of Embodiment of the invention.

FIG. 1 is a plan view showing an example of the wiring pattern of a wiring substrate used with the manufacturing method of the semiconductor device of Embodiment of the invention; FIG. 2 is an enlarged part plan view showing the configuration of the A section shown in FIG. 1; FIG. 3 is an assembly flow diagram showing an example of the assembly to the flip chip bonding in the manufacturing method of the semiconductor device of Embodiment of the invention; FIG. 4 is an assembly flow diagram showing an example of the assembly after the flip chip bonding in the manufacturing method of the semiconductor device of Embodiment of the invention; FIG. 5 is an expanded sectional view showing an example of the thermocompression bonding step in the assembly flow shown in FIG. 3; FIG. 6 is a sectional view comparing and showing two examples of the solder formation method to the terminal row of a wiring substrate in the manufacturing method of the semiconductor device of Embodiment of the invention; FIG. 7 is a partially sectional view showing an example of the application state of soldering paste to a terminal row in the manufacturing method of the semiconductor device of Embodiment of the invention; FIG. 8 is a partially sectional view showing an example of the configuration after cleaning of the application state of soldering paste shown in FIG. 7, and the configuration of the second terminal of a solder-pre-coating-less area; FIG. 9 is an enlarged part sectional view showing an example of the configuration of flip chip bonding in the manufacturing method of the semiconductor device of Embodiment of the invention; FIG. 10 and FIG. 11 are respectively an enlarged part sectional view showing the configuration of flip chip bonding of the modification in the manufacturing method of the semiconductor device of Embodiment of the invention; FIG. 12 to FIG. 14 are respectively an enlarged part plan view showing the modification of the configuration of the A section shown in FIG. 1; and FIG. 15 is an enlarged part plan view showing the configuration of a wiring substrate of the modification of Embodiment of the invention.

The manufacturing method of a semiconductor device of Embodiment is a manufacturing method of a semiconductor device for flip chip bonding of the semiconductor chip 1 to be performed at a wiring substrate. Chip stacked layer type SIP (System In Package) 13 stacking and mounting two semiconductor chips 1 and 2 is taken up and explained as an example of said semiconductor device.

SIP 13 of Embodiment has semiconductor chip 1 of the first stage and semiconductor chip (other semiconductor chip) 2 of the second stage stacked on it, as shown in FIG. 4. Flip chip bonding of semiconductor chip 1 of the first stage is made via gold bump (projection electrode) 1d shown in FIG. 5 on main surface 5a of package substrate 5 which is a wiring substrate. Semiconductor chip 2 of the second stage is electrically connected with package substrate 5 mounted by stacking on back surface 1b of semiconductor chip 1 of the first stage by wire bonding.

That is, in SIP 13, face down mounting of semiconductor chip 1 of the first stage is performed on package substrate 5, and face-up mounting of semiconductor chip 2 of the second stage is performed on semiconductor chip 1 of the first stage.

Next, package substrate 5 used for SIP 13, shown in FIG. 1 and being a wiring substrate is explained.

In main surface 5a of package substrate 5, a plurality of wiring parts 5c including copper etc., a plurality of terminals (first terminals) 5e for a flip chip for flip chip bonding, dummy terminals 5d arranged at the end portions of the terminal row by a plurality of terminals 5e for a flip chip, and a plurality of wire connection terminals (second terminals) 5f for wire bonding are provided. As shown in FIG. 2, connecting part 5m for connecting with gold bump 1d shown FIG. 5 is formed at each terminal 5e for a flip chip.

These terminals are divided into the terminal for solder pre-coating to be formed, and the terminal for solder pre-coating not to be formed in package substrate 5. That is, in flip chip bonding of Embodiment, in order to make gold-solder bonding by gold bump 1d and solder, it is necessary to form solder pre-coating, i.e., solder layer 4 as shown in FIG. 6, on terminal 5e for a flip chip. On the other hand, in order that wire connection terminal 5f may make the gold-gold bonding with wire 6 (gold wire), as shown in FIG. 8, it is preferred that coating of gold plating (precious-metal plating) 5g is performed to the surface of wire connection terminal 5f, and solder pre-coating's are unnecessary.

Next, the manufacturing method of a semiconductor device of Embodiment is explained using the assembly flow shown in FIG. 3 and FIG. 4.

First, the preparation of a wiring substrate shown in step S1 is made.

Here, package substrate 5 as shown in FIG. 1 is prepared. A plurality of terminals (first terminals) 5e for a flip chip arranged corresponding to the arrangement of pad (electrode) 1c of semiconductor chip 1 by which flip chip bonding is performed so that a quadrangle might be accomplished are formed in main surface 5a of package substrate 5, and further dummy terminals 5d are provided in the end portions of each row of this terminal 5e for a flip chip. That is, as shown in FIG. 2, dummy terminals 5d are provided near each corner part of the quadrangular arrangement including a plurality of terminals 5e. for a flip chip.

A plurality of wire connection terminals (second terminals) 5f are provided approaching to terminal 5e for a flip chip in package substrate 5. This wire connection terminal 5f is a terminal for connecting with semiconductor chip 2 of the second stage mounted by stacking on semiconductor chip 1 with wire 6, therefore coating of gold plating (precious-metal plating) 5g is performed to that surface.

That is, package substrate 5 has, in the main surface 5a, as shown in FIG. 8, the solder pre-coating formation area where a plurality of terminals 5e for a flip chip forming solder layer 4 for solder pre-coating have been arranged and the solder-pre-coating-less area which is close to said solder pre-coating formation area and where a plurality of wire connection terminals 5f not forming solder layer 4 for solder pre-coating have been arranged.

A plurality of wiring parts 5c are formed in main surface 5a of package substrate 5.

Then, as shown in step S2 of FIG. 3, solder application is performed. That is, as shown in FIG. 8, solder layer 4 for solder pre-coating is formed on each terminal 5e for a flip chip. In package substrate 5, as to the flip chip bonding with semiconductor chip 1, in order to make gold-solder bonding by gold bump 1d and solder, it is necessary to form solder layer 4 (solder pre-coating) on each terminal 5e for a flip chip, but on the other hand, as to wire connection terminals 5f, to make gold-gold bonding with wire 6 (gold wire), solder layer 4 is unnecessary.

Here, two examples are explained using FIG. 6 about the formation method of solder layer 4 on each terminal 5e for a flip chip.

The method shown in (A) of FIG. 6 applies solder powder 9, and at first performs chemical treatment to terminal 5e for a flip chip containing copper (Cu) to which simple cleaning by etching was performed, and covers terminal 5e for a flip chip by adhesion film 8.

Solder powders 9 containing the particles of solder are applied to an area including the row of a plurality of terminals 5e for a flip chip by solder powder bathing. Then, flux 10 is applied in cleaning and solder is melted by heating flux 10 with performing reflow further. In that case, securing the solder of sufficient thickness on each terminal 5e for a flip chip suppressing the flow of flux 10 with 5d of dummy terminals, solder layer 4 is formed.

That is, if flux 10 flows, the reaction of solder will worsen, and the particles of solder will not be connected with the oxide film of the particles of solder being unremovable, and poor solder layer 4 will be formed. As a result, although the flat surface in which flip chip bonding is possible is no longer formed in solder layer 4, like Embodiment, at the time of reflow, by suppressing outflow of flux 10 by dummy terminals 5d serving as a wall, while fully being able to secure the thickness of solder layer 4 formed on each terminal 5e for a flip chip making good the reaction of solder in each terminal 5e for a flip chip, the flat surface in which flip chip bonding is possible can be formed in each solder layer 4.

Washing by water is performed after reflow to solder layer 4 on each terminal 5e for a flip chip.

Next, the method shown in (B) of FIG. 6 applies soldering paste 3, and performs paste printing first to terminal 5e for a flip chip containing copper (Cu). That is, as shown in FIG. 7, soldering paste 3 containing the particles of solder is applied to an area including the row of a plurality of terminals 5e for a flip chip. Flux 10 is applied and solder is melted by heating flux 10 with performing reflow after that. In that case, suppressing the flow of solder and flux 10 with dummy terminals 5d, as shown in FIG. 8, solder layer 4 of sufficient thickness can be formed on each terminal 5e for a flip chip.

Namely, since it is possible to fully secure solder thickness on each terminal 5e for a flip chip by suppressing the outflow of solder and flux 10 serving dummy terminals 5d as a wall at the time of reflow, solder layer 4 formed on each terminal 5e for a flip chip can be made thick enough.

If flux 10 runs short, sufficient amount of particles of solder is not activated and the effective solder pre-coating will decrease, but in Embodiment, since dummy terminals 5d suppress the outflow of solder and flux 10 serving as a wall, sufficient amount of particles of solder can be activated and the amount of effective solder pre-coating can be secured.

In package substrate 5 of Embodiment, since it has a solder pre-coating formation area and a solder-pre-coating-less area in the main surface 5a, soldering paste 3 cannot be applied thickly and widely. Therefore, by arranging dummy terminals 5d at the end portion of the row of terminal 5e for a flip chip of package substrate 5, the outflow of solder and flux 10 at the time of reflow can be suppressed dummy terminals 5d serving as a wall, and solder layer 4 can be formed by sufficient thickness on each terminal 5e for a flip chip.

Since the outflow of solder and flux 10 at the time of reflow can be suppressed dummy terminals 5d serving as a wall, as shown in FIG. 8, the outflow of the solder to the solder-pre-coating-less area where wire connection terminals 5f have been arranged can be prevented.

Thereby, solder layer 4 can be formed on each terminal 5e for a flip chip, without making solder adhere to wire connection terminals 5f closely formed to terminal 5e for a flip chip.

On dummy terminal 5d arranged at the end portion of a terminal row, since the languishing phenomenon shown in FIG. 7 happens as solder and flux 10 flowed through, as shown in FIG. 8, solder layer 4 whose thickness is thinner than solder layer 4 formed on a plurality of terminals 5e for a flip chip is formed on dummy terminal 5d.

Cleaning of ultrasonic cleaning etc. is performed after reflow and the solder between adjoining terminals 5e for a flip chip is removed.

Then, as shown in step S3 of FIG. 3, an NCP (Non-Conductive Paste) application is performed. That is, NCP 7 which is non-conductive resin adhesive is arranged on main surface 5a of package substrate 5 after the solder application step of step S2. NCP 7 is supplied on package substrate 5 from nozzle 14. As adhesives for chip fixation, not only NCP 7 but paste state conductive resin adhesive, non-conductive film-like resin adhesive, or conductive film-like resin adhesive etc. may be used.

Then, chip mounting which is shown in step S4 of FIG. 3 is performed. Here, semiconductor chip 1 is arranged on main surface 5a of package substrate 5 via NCP 7. In that case, main surface 1a of semiconductor chip 1 is made to oppose with main surface 5a of package substrate 5, and semiconductor chip 1 is arranged by face down.

Thermo compression bonding shown in step S5 of FIG. 3 is performed. Here, application-of-pressure block 15 gives heat and a load to semiconductor chip 1 from the upper part of semiconductor chip 1 arranged on package substrate 5 on stage 17, and semiconductor chip 1 is adhered to package substrate 5 by thermo compression bonding.

In that case, as shown in FIG. 5, alignment of gold bump 1d connected to pad 1c of semiconductor chip 1 and the terminal 5e for a flip chip of package substrate 5 corresponding to this is performed, and they are bonded by thermo-compression. By this, gold bump 1d on semiconductor chip 1, and solder layer 4 shown in FIG. 3 on terminal 5e for a flip chip connect, and flip chip bonding is completed. As shown in FIG. 5, by thermo compression bonding, NCP 7 arranged under a chip spreads in the whole main surface 1a of semiconductor chip 1, and protects each flip chip connecting part. On main surface 5a of package substrate 5, insulating layer (solder-resist film) 5k other than terminal 5e for a flip chip is formed.

According to a manufacturing method of a semiconductor device of Embodiment, by forming dummy terminals 5d in the end portion of the row of a plurality of terminals 5e for a flip chip in package substrate 5, the outflow of flux 10 is suppressed and the amount of flux 10 supplied on terminal 5e for a flip chip is stabilized. By stabilizing the amount of flux 10, even when flux 10 with low activity over solder is used, fully securing the amount of the solder on each terminal 5e for a flip chip, thickness of solder layer 4 formed on terminal 5e for a flip chip can be made thick enough, and, as a result, improvement in the reliability of flip chip bonding can be aimed at.

The application of adhesives, such as NCP 7, may be performed after flip chip bonding. In that case, after adhering semiconductor chip 1 by thermo compression bonding, dropping adhesives with fluidity from a chip side face as an under-filling sealing agent and pouring them between chip-substrate, a molding is performed.

After the completion of flip chip bonding of semiconductor chip 1 of the first stage, on back surface 1b of semiconductor chip 1, semiconductor chip 2 of the second stage which is an other semiconductor chip is stacked and mounted.

In that case, first, as shown in step S6 of FIG. 4, paste coating which applies paste material by multipoint type nozzle 16 on back surface 1b of semiconductor chip 1 of the first stage is performed.

Then, as shown in step S7, chip mounting which stacks and mounts semiconductor chip 2 of the second stage on back surface 1b of semiconductor chip 1 is performed. Here, main surface 2a of semiconductor chip 2 is turned up, and back surface 2b of semiconductor chip 2 and back surface 1b of semiconductor chip 1 are connected. That is, face-up mounting of the semiconductor chip 2 is performed on semiconductor chip 1.

Then, wire bonding shown in step S8 is performed. That is, the electrode of semiconductor chip 2 and wire connection terminal 5f of package substrate 5 are connected with conductive wire (for example, gold wire) 6. Since dummy terminals 5d serve as a wall and the outflow of solder and flux 10 at the time of reflow at the time of forming solder layer 4 can be suppressed for terminal 5e for a flip chip of package substrate 5 in the manufacturing method of the semiconductor device of Embodiment, the outflow of solder into the solder-pre-coating-less area where wire connection terminals 5f have been arranged can be prevented, and as a result, since solder has not adhered to wire connection terminals 5f, wire connection terminal 5f is certainly connectable with wire 6.

Then, molding shown in step S9 is performed. That is, resin molding is performed using the resin for molding, and molded body 12 is formed. The resin for molding which forms molded body 12 is thermosetting resin of an epoxy system etc., for example.

Then, ball attachment shown in step S10 is performed. Here, a plurality of solder balls 11 used as external terminals are attached to back surface 5b of package substrate 5. For example, a plurality of solder balls 11 are arranged in grid-like manner at the back surface 5b of package substrate 5. This becomes assembly completion of SIP 13.

Next, the kinds of dummy terminal 5d in package substrate 5 of SIP 13, and the existence of the projection electrode (gold bump 1d) of a chip side in the flip chip bonding are explained.

FIG. 9 shows the configuration where the projection electrode of the chip side corresponding to dummy terminal 5d is not formed, and the pattern of dummy terminals 5d in that case is the configuration shown in FIG. 2, for example. That is, since dummy terminals 5d are not connected with semiconductor chip 1, connecting parts 5m are not formed in dummy terminals 5d. Therefore, dummy terminals 5d in this case are in the condition of having insulated with semiconductor chip 1.

In the configuration shown in FIG. 9 where the projection electrode of the chip side corresponding to dummy terminal 5d is not formed, as shown in the modification of FIG. 12, dummy terminal 5d formed at the end may be connected with nearby signal wiring 5i of a substrate side. In this case, although not connecting directly with semiconductor chip 1, dummy terminal 5d is in the condition of having connected with semiconductor chip 1 via nearby signal wiring 5i.

The modification shown in FIG. 10 is a configuration where gold bump 1d of the chip side corresponding to dummy terminal 5d is formed, and flip chip bonding of dummy terminal 5d and the gold bump 1d was performed via solder layer 4. Dummy terminals 5d in this case may be in the condition that those ends were insulated without connecting with other wiring, as shown in the modification of FIG. 13, for example. Pad 1c of semiconductor chip 1 connected via gold bump 1d is, if being the shape either insulated with the component of the chip side or connected to the circuit which is not used at the time of the action of a semiconductor device, for example a test circuit, even when connecting with the component of a chip side temporarily, for example such as a non connection electrode, an electrode for test pins, etc., suitable as an object which constitutes bonding with dummy terminal 5d with low connection reliability. Connecting part 5m for connecting with gold bump 1d is formed in dummy terminal 5d.

The modification shown in FIG. 11 is a configuration where gold bump 1d of the chip side corresponding to dummy terminal 5d is formed, and flip chip bonding of dummy terminal 5d and the gold bump 1d was performed via solder layer 4 like the configuration of FIG. 10. As for dummy terminal 5d in this case, as shown in the modification of FIG. 14 for example, connecting part 5m for connecting with gold bump 1d is formed, and the end is connected with an adjoining common wiring, such as GND wiring (power supply wiring is sufficient) 5j, of package substrate 5.

When connecting with GND, a power source, etc., as shown in FIG. 11, it may connect with wiring 1e in a chip formed in the inside of semiconductor chip 1. Namely, by communalizing dummy terminal 5d, and either of terminals 5e for a flip chip with wiring 1e in a chip, even if dummy terminal 5d with low connection reliability will be in a non-contact state, the feed of GND or a power source to the circuit in a chip will not cease.

Next, the modification shown in FIG. 15 is explained.

FIG. 15 shows the substrate configuration where solder-resist wall part 5h which is an insulating wall part was formed at the end portion of the row of terminals 5e for a flip chip. When forming solder pre-coating on each terminal 5e for a flip chip, soldering paste 3 or solder powder 9 is melted by heating flux 10. In that case, by solder-resist wall part 5h, the flow of flux 10 is suppressed and solder layer 4 is formed on each terminal 5e for a flip chip.

That is, solder-resist wall part 5h is formed at the end portion of the row of terminals 5e for a flip chip as a substitute of dummy terminal 5d. Usually, opening of a solder-resist film extends and exists to a corner part, as shown in FIG. 14, and it is connected with opening of other side in the corner part, and the wall part is not formed. However, as shown in FIG. 15, the flow of flux 10 or solder can be suppressed by forming solder-resist wall part 5h in the enough neighborhood of the part equivalent to the end portion of the row of terminals 5e for a flip chip. And like the case of dummy terminal 5d, on a plurality of terminals 5e for a flip chip, solder can fully be secured and solder layer 4 can be formed. In order to prevent the outflow of flux 10 and solder better, it is preferred to make distance from the terminal of the end of the row of terminals 5e for a flip chip to solder-resist wall part 5h as small as possible. As for the distance from the terminal of the end of the row of terminals 5e for a flip chip to solder-resist wall part 5h, concretely, it is preferred that the distance is smaller than the greatest thing of the spacing of terminals 5e for the flip chip formed in each solder-resist opening. Thus, the outflow of flux 10 can be effectively prevented like the case where dummy terminal 5d has been arranged, by arranging solder-resist wall part 5h in distance smaller than the maximum spacing of terminals 5e for a flip chip.

Therefore, solder layer 4 of sufficient thickness on each terminal 5e for a flip chip can be formed, and, as a result, improvement in the reliability of flip chip bonding can be aimed at like the case of dummy terminal 5d.

As things mentioned above, the present invention accomplished by the present inventors was concretely explained based on an above embodiment, but the present invention is not limited by above embodiments, variations and modifications may be made, of course, in various ways in the limit that does not deviate from the gist.

For example, said Embodiment explained the manufacturing method in which solder layer 4 is formed on each terminal 5e for a flip chip after preparing a wiring substrate. However, in the manufacturing method of a semiconductor device of the present invention, package substrate (wiring substrate) 5 of which solder layer 4 was formed on each terminal 5e for a flip chip may be delivered and prepared beforehand, and a semiconductor device, such as SIP 13 may be assembled using this package substrate 5.

In said Embodiment, although the case where dummy terminal 5d was formed at the end portion of the row of terminals 5e for a flip chip was explained, dummy terminal 5d may be formed not only in an end portion but in the part of the central side of said row. For example, when the space where the distance between adjoining terminals was vacant more than double of the pitch between terminals, exists in the part of the central side of a row, dummy terminal 5d may be formed in the space.

Said Embodiment took up and explained SIP 13 as an example of a semiconductor device. However, said semiconductor device, if being a device in which solder layer 4 is formed on terminal 5e for a flip chip, and which is assembled performing flip chip bonding via solder layer 4, may be other semiconductor device, such as BGA, and LGA (Land Grid Array), other than SIP 13.

The present invention is suitable for semiconductor manufacturing technology.

What is claimed is:

1. A manufacturing method of a semiconductor device for flip chip bonding of a semiconductor chip to be performed, comprising the steps of:
    (a) preparing a wiring substrate having a main surface and a back surface, a plurality of first terminals for flip chip bonding being formed constituting a row in the main surface, a dummy terminal being formed at an end portion of the row of the first terminals, and having a second terminal whose surface is covered by precious-metal plating approaching the plurality of first terminals;
    (b) forming a solder layer over the plurality of first terminals by forming a condition that flux containing particles of solder is applied to an area including the row of the plurality of first terminals, melting the solder by heating the flux after that, and suppressing a flow of the flux with the dummy terminal, wherein in the step (b), a solder layer is formed over the plurality of first terminals by applying solder powders containing particles of solder to the area including the row of the plurality of first terminals, then applying flux, further-more melting the solder by heating the flux performing reflow, and suppressing a flow of the flux with the dummy terminal;
    (c) arranging the semiconductor chip over the main surface of the wiring substrate; and
    (d) performing flip chip bonding of the semiconductor chip at the wiring substrate connecting a projection electrode connected over an electrode of the semiconductor chip, and the solder layer over the first terminal by thermo compression bonding.

2. A manufacturing method of a semiconductor device according to claim 1, wherein in the step (b),
    a solder layer is formed over the plurality of first terminals by applying a soldering paste containing particles of solder to the area including the row of the plurality of first terminals, then applying flux, furthermore melting the solder by heating the flux performing reflow, and suppressing a flow of the flux and the solder with the dummy terminal; and
    the solder between the adjoining first terminals is removed by cleaning furthermore.

3. A manufacturing method of a semiconductor device according to claim 1, wherein
    the projection electrode corresponding to the dummy terminal is not formed, and the dummy terminal does not connect with the semiconductor chip.

4. A manufacturing method of a semiconductor device according to claim 1, wherein
    the electrode of the semiconductor chip corresponding to the dummy terminal is a non connection electrode, and the dummy terminal is connected with the non connection electrode of the semiconductor chip.

5. A manufacturing method of a semiconductor device according to claim 1, wherein
    the dummy terminal and the electrode of the semiconductor chip corresponding to this are connected via a projection electrode, and the dummy terminal and either of the first terminals are connected to GND or a power source by a wiring in a chip.

6. A manufacturing method of a semiconductor device according to claim 1, wherein
    the dummy terminal and the electrode of the semiconductor chip corresponding to this are connected via a projection electrode, and the dummy terminal and either of the first terminals are connected to GND or a power source by a wiring over the wiring substrate.

7. A manufacturing method of a semiconductor device according to claim 1, wherein
    in the step (b), a solder layer whose thickness is thinner than a solder layer formed over the plurality of first terminals is formed over the dummy terminal.

8. A manufacturing method of a semiconductor device according to claim 1, wherein
    after the step (d), other semiconductor chip is stacked and mounted over a back surface of the semiconductor chip, and an electrode of the other semiconductor chip and the second terminal of the wiring substrate are connected with a conductive wire after that.

9. A manufacturing method of a semiconductor device according to claim 1, wherein
    after the step (b), and in the step (c), non-conductive resin adhesive is arranged over the main surface of the wiring substrate, and the semiconductor chip is arranged over the main surface of the wiring substrate via the resin adhesive after that.

* * * * *